United States Patent
Schupp et al.

(10) Patent No.: US 11,180,845 B2
(45) Date of Patent: Nov. 23, 2021

(54) METHOD OF LASER INDUCED MARKING OF AN ARTICLE

(71) Applicant: Braun GmbH, Kronberg (DE)

(72) Inventors: Ralf Schupp, Brechen (DE); Harald De Buhr, Frankfurt (DE)

(73) Assignee: Braun GmbH, Kronberg (DE)

( * ) Notice: Subject to any disclaimer, the term of this patent is extended or adjusted under 35 U.S.C. 154(b) by 4 days.

(21) Appl. No.: 16/176,279

(22) Filed: Oct. 31, 2018

(65) Prior Publication Data

US 2019/0062896 A1 Feb. 28, 2019

Related U.S. Application Data

(62) Division of application No. 14/570,583, filed on Dec. 15, 2014, now Pat. No. 10,145,002.

(30) Foreign Application Priority Data

Dec. 17, 2013 (EP) ..................................... 13197705

(51) Int. Cl.
*C23C 14/04* (2006.01)
*C23C 14/22* (2006.01)
(Continued)

(52) U.S. Cl.
CPC .......... *C23C 14/048* (2013.01); *B23K 26/009* (2013.01); *B23K 26/082* (2015.10);
(Continued)

(58) Field of Classification Search
None
See application file for complete search history.

(56) References Cited

U.S. PATENT DOCUMENTS 3,377,697 A 4/1968 Hobbs
H158 H 11/1986 Frausto et al.
(Continued)

FOREIGN PATENT DOCUMENTS

DE 195 176 25 A1 11/1996
DE 19811028 A1 9/1999
(Continued)

OTHER PUBLICATIONS

EPlastics (http://www.eplastics.com/Plexiglass_Acrylic_SheeUnfrared_ Transmitting, accessed online Mar. 3, 2017).
(Continued)

*Primary Examiner* — Charles Capozzi
(74) *Attorney, Agent, or Firm* — Vladimir Vitenberg (57) ABSTRACT

A device for laser-induced marking of an article having a marking surface comprising a non-flat portion to be marked, the device comprising: a first laser unit for emitting and scanning first laser light over a first transfer area; a first foil unit for providing a first laser transfer foil at the first transfer area; a carrier for providing the article at the first transfer area, the article having a marking surface comprising a non-flat surface area; a first hard adaptor that is transparent for the first laser light, the first hard adapter having a first contacting surface that is essentially a negative of the non-flat surface area of the marking surface; and a contacting unit for bringing the first laser transfer foil in contact with the marking surface by causing the first contacting surface to move one of the first laser transfer foil and the marking surface towards one another.

9 Claims, 4 Drawing Sheets

(51) Int. Cl.
  *B41M 5/382*    (2006.01)
  *B41J 2/435*    (2006.01)
  *B23K 26/00*    (2014.01)
  *B23K 26/08*    (2014.01)
  *B23K 26/082*   (2014.01)

(52) U.S. Cl.
  CPC ........... *B23K 26/0846* (2013.01); *B41J 2/435* (2013.01); *B41M 5/38207* (2013.01); *B41M 5/38221* (2013.01); *C23C 14/22* (2013.01); *B41M 2205/02* (2013.01)

(56) References Cited

U.S. PATENT DOCUMENTS

| | | | |
|---|---|---|---|
| 4,987,006 A | 1/1991 | Williams et al. | |
| 5,820,971 A | 10/1998 | Kaule et al. | |
| 5,851,720 A | 12/1998 | Shinohara | |
| 6,245,397 B1 * | 6/2001 | Watanabe | B41M 5/267 156/155 |
| 6,294,241 B1 | 9/2001 | Kaule et al. | |
| 6,493,014 B2 | 12/2002 | Aroneo | |
| 7,097,726 B2 | 8/2006 | Hattori et al. | |
| 2015/0167147 A1 | 6/2015 | Schupp et al. | |

FOREIGN PATENT DOCUMENTS

| | | |
|---|---|---|
| FR | 2 294 862 A1 | 7/1976 |
| WO | WO 2004/080725 A1 | 9/2004 |
| WO | WO 2008/092649 A2 | 8/2008 |

OTHER PUBLICATIONS

Extended European Search Report and Search Opinion; Application Ser. No. 13197705.0; dated May 13, 2014; 5 pages.
International Search Report and Written Opinion; Application Ser. No. PCT/IB2014/066166; dated Jan. 15, 2015; 10 pages.
"All Office Actions, U.S. Appl. No. 14/570,583".

* cited by examiner

METHOD OF LASER INDUCED MARKING OF AN ARTICLE

FIELD OF THE INVENTION

The present invention is concerned with laser induced pigment transfer from a laser transfer foil to an article and in particular with a method to transfer pigments from a foil by use of a laser to an in particular non-flat surface of an article.

BACKGROUND OF THE INVENTION

It is known to selectively mark/inscribe surfaces of articles with marking content (generally dyes, e.g. pigments or metal particles) from a laser transfer foil by bringing the laser transfer foil into intimate contact with the article surface and applying laser light so that dyes, e.g. pigments, are transferred from the foil to the article (e.g. by separating the pigments from the foil and adhering them to the article surface or by bringing the pigments into a gaseous phase and diffusing them into the article surface). In order to bring the laser transfer foil into contact with the article surface, a vacuum may be applied that by means of suction forces brings the transfer foil into close contact with the article surface. International patent application WO 2008/092649A2 generally discloses such a technology.

It is further known that a non-flat surface of a glass article may be marked by applying a transfer foil over the non-flat surface and irradiating a laser beam from the backside of the glass article onto the transfer foil. Patent application DE 195 176 25 A1 discloses such a technology.

It is an object of the present disclosure to provide a method and a device for marking of an article surface that is improved over the known methods and devices or at least provides an alternative to such methods and devices.

SUMMARY OF THE INVENTION

In accordance with one aspect there is provided a method of laser-induced marking of a article comprising the steps of providing an article, the article having a marking surface intended for being marked, in particular where the marking surface is a non-flat surface, providing a first laser transfer foil, providing a first laser unit for emitting first laser light, providing a first hard adaptor being essentially transparent to the first laser light, the first hard adaptor having a contacting surface that essentially is a negative of at least a part of the marking surface of the article, contacting the first laser transfer foil with the marking surface of the article by means of the first hard adaptor such that the first laser transfer foil is arranged between the marking surface of the article and the contacting surface of the first hard adaptor, and irradiating the first laser light through the first hard adaptor onto the first laser transfer foil.

In accordance with one aspect there is provided a device for laser-induced marking of a article, comprising a first laser unit for emitting and in particular scanning first laser light over a first transfer area, a first foil unit for providing a first laser transfer foil at the first transfer area, a carrier for providing an article at the first transfer area, the article having a marking surface, in particular where the marking surface is a non-flat surface, a first hard adaptor being transparent for the first laser light and having a contacting surface that is essentially a negative of at least a part of the marking surface of the article, a contacting unit for bringing the first laser transfer foil in contact with the marking surface of the article by pushing the first laser transfer foil against the marking surface of the article by the respective contacting surface of the first hard adaptor.

BRIEF DESCRIPTION OF THE DRAWINGS

The present disclosure will be further elucidated by a detailed description of example embodiments and with reference to figures. In the figures

DETAILED DESCRIPTION OF THE INVENTION

A "laser" in accordance with the described methods or devices shall not be limited to a particular laser type but all suitable lasers should be considered such as Nd:YAG lasers, excimer lasers, nitrogen lasers, CO or $CO_2$ lasers or other known gas or solid state lasers. These lasers may emit laser light having a wavelength in a range of between about 100 nanometer (nm) to about 20.000 nm, in particular of between about 150 nm to about 1200 nm.

A "hard adaptor" in accordance with the present disclosure shall be made from materials such as amorphous glass, transparent ceramics or plastic or crystalline glass. The optical properties of "optical glass" (as e.g. marketed by Schott AG, Mainz, Germany) can be precisely tuned by addition of certain chemical components and a person skilled in the art can choose the glass variety for a given laser wavelength from the off-the-shelf available glass types. E.g. Schott's high transmission glass variant N-BK7HT has a transmission coefficient of around 0.998 at a wavelength of 532 nm (doubled frequency of a Nd:YAG laser).

The term "essentially a negative" as used in the present disclosure to describe the relationship of two surfaces shall mean that the two surface can deviate insofar as the surface may be designed such that they contact each other first in a central region, so that air in pushed outwards, when the two surfaces are moved together. E.g. if a marking surface would be flat, the contacting surface would typically be slightly convex or if the marking surface would be convex, the contacting surface would be concave, but to a lesser degree.

A method as proposed in the present disclosure may further comprise at least one or more of the following steps or sequences of steps:

separating the first hard adaptor and the first laser transfer foil from the article; moving the first laser transfer foil with respect to the article; and again contacting the first laser transfer foil with the marking surface of the article by means of the first hard adaptor such that the first laser transfer foil is arranged between the marking surface of the article and the contacting surface the first hard adaptor;

separating the first hard adaptor and the first laser transfer foil from the article; providing a second laser transfer foil having a different marking content than the first laser transfer foil; and contacting the second laser transfer foil with the marking surface of the article by means of the first hard adaptor such that the second laser transfer foil is arranged between the marking surface of the article and the contacting surface of the first hard adaptor;

separating the first hard adaptor and the first laser transfer foil from the article; providing a second hard adaptor having a contacting surface that essentially is a negative of at least a part of the marking surface of the article, in particular where the contacting surface of the second hard adaptor essentially is a negative of a different part of the marking surface of the article than the contacting surface of the first hard adaptor, the second hard adaptor being essentially transparent to the first laser light or a second laser light different to the first laser light; and contacting the first laser transfer foil or a second laser transfer foil with the marking surface of the article by means of the second hard adaptor such that the first or second laser transfer foil is arranged between the marking surface of the article and the contacting surface of the second hard adaptor;

providing a soft material layer being essentially transparent to the laser light between the first hard adaptor and the first laser transfer foil.

A device as proposed may in addition further comprise at least one or more of the following features or feature combinations:

- a soft layer material arranged between the first hard adaptor and the first laser transfer foil, the soft material layer being transparent to the first laser light; in particular a soft layer unit for providing the soft layer material;
- a second hard adaptor being transparent to the first laser light or a second laser light being different to the first laser light and having a contacting surface that essentially is a negative of at least a part of the marking surface of the article;
- a second foil unit for providing a second laser transfer foil at the first or a second transfer area;
- a second laser unit for emitting and in particular scanning a second laser light over the first or a second transfer area, where the second laser light may have the same or a different wavelength than the first laser light.

The methods and devices described herein provide possibilities to mark or inscribe marking surfaces of articles by using a hard adaptor that is essentially transparent to the used laser light and optionally of a soft material layer being essentially transparent to the used laser light. The hard adaptor is formed so as to have a contacting surface that essentially is a negative of the portion of the marking surface of the article to be marked. The article may in particular be at least partially made from plastic in the region to be marked. A series of articles to be sequentially marked may show a certain tolerance of its geometrical dimensions. The hard adaptor may elastically deform the article (in particular if the contacting region is made from plastic) to a certain degree and may thus balance out these tolerances so that the laser transfer foil is in intimate contact with the marking surface of the article and the contacting surface of the hard adaptor at least in the region to be marked. A soft material layer may be used in order to balance out geometrical tolerances too large to be accommodated by the hard adaptor. The soft material layer may in particular have elastic and resilient properties.

Figure 1:
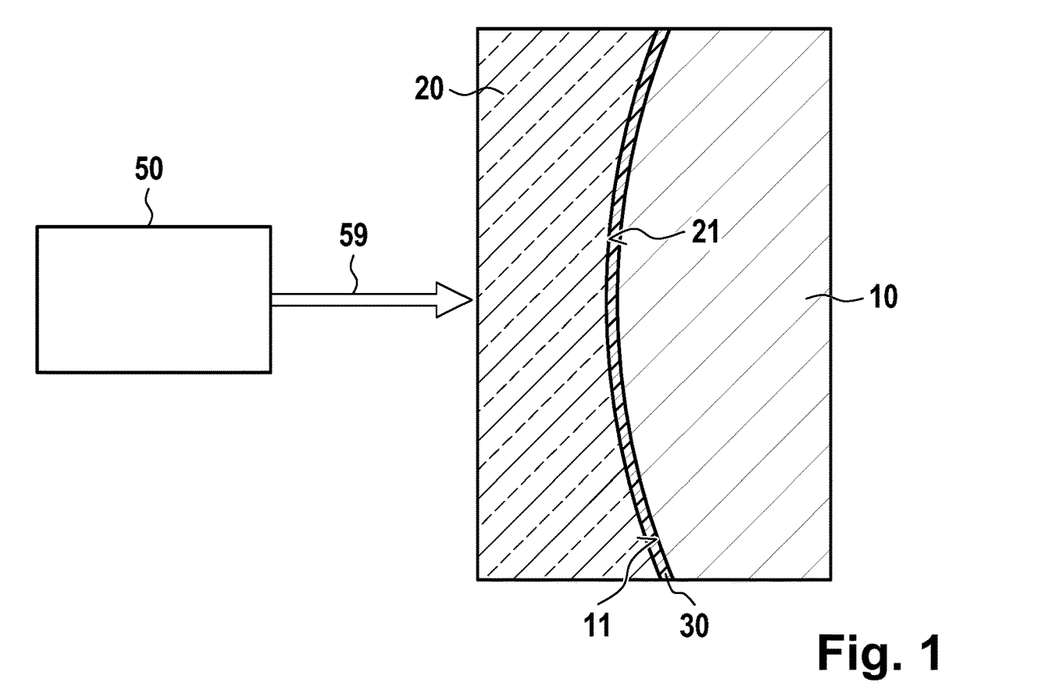
FIG. 1 is a schematic depiction of a first hard adaptor holding a first laser transfer foil in close contact with a marking surface of an article.

FIG. 1 is a schematic depiction of a article 10 having a marking surface 11 intended for being marked and of a first hard adaptor 20 having a contacting surface 21 that essentially is the negative of at least a part of the marking surface 11 of the article 10, where a first laser transfer foil 30 is sandwiched between the first hard adaptor 20 and the article 10 so that the first laser transfer foil 30 is in intimate (or close) contact with the respective portion of the marking surface 11 of the article 10. A laser unit 50 is shown that irradiates a first laser light 59 in the form of a laser beam having a wavelength (e.g. 532 nm for a frequency doubled Nd:YAG laser naturally emitting at a wavelength of 1064 nm) through the first hard adaptor 20, which is made from a material that is essentially transparent to the first laser light. The first laser light impinges onto the first laser transfer foil 30 that absorbs the first laser light at a sufficient rate so that marking content (dyes, e.g. metallic powder or color pigments) provided in or at the laser transfer foil 30 are applied to the marking surface 11 of the article 10 as is generally known in the art.

FIG. 1 shows a scenario where the marking surface of the article is a non-flat surface (here: convexly shaped) and the contacting surface of the first hard adaptor is also a non-flat surface as it essentially is a negative of the marking surface. Generally, as has been mentioned before, the same set-up can of course also be used for a flat marking surface. It is believed that the method and device described herein tend to have an even higher benefit over prior art methods or devices for non-flat marking surfaces.

Figure 2:
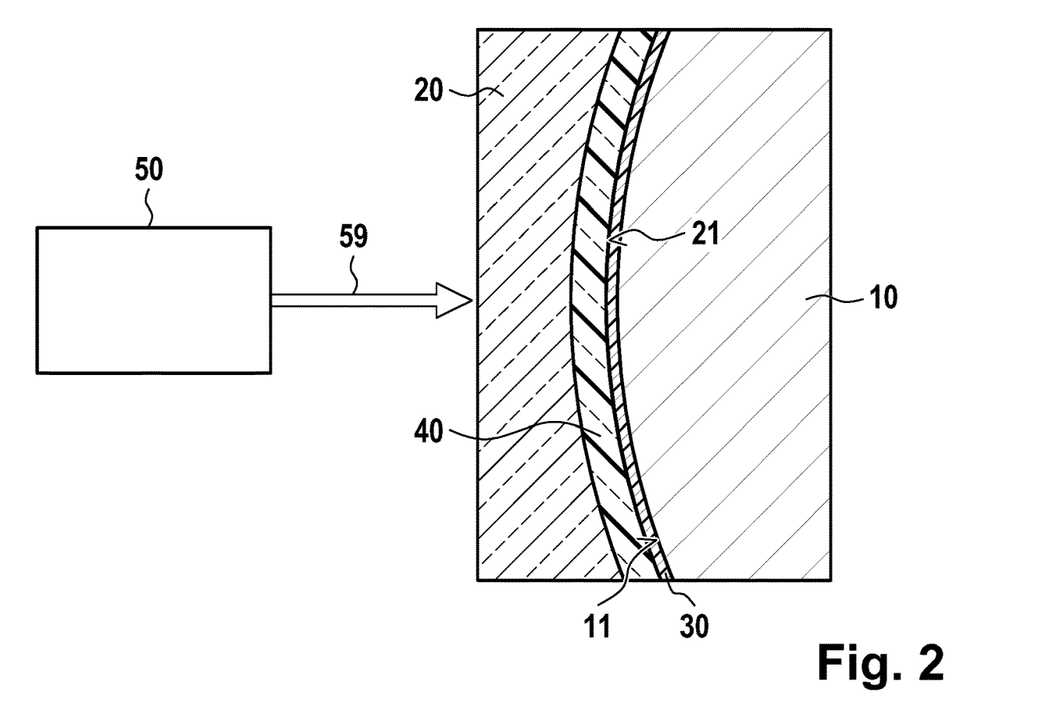
FIG. 2 is a schematic depiction similar to FIG. 1 but where an additional soft material layer is arranged between the first hard adaptor and the first laser transfer foil.

FIG. 2 is a schematic depiction similar to FIG. 1 (and the same features have thus received the same reference numerals), but where additionally a soft material layer 40 is arranged between the first hard adaptor 20 and the article 10, where the first laser transfer foil 30 is arranged between the soft material layer 40 and the article 10. The soft material layer 40 is made from a material being optically essentially transparent to the wavelength of the first laser light. Generally and applicable to all embodiments, the thickness of the soft material layer measured between the first hard adaptor and the first laser transfer foil may be in the range of between about 50 microns (μm) to about 5 mm Due to its soft and optionally resilient properties, the soft material layer 40 is able to balance tolerances between the geometry of the marking surface 11 of the article and the negative contacting surface 21 of the first hard adaptor as was previously mentioned. E.g. if the article is a housing of a replacement brush head of an electric toothbrush or a housing of an electric toothbrush, tolerances of the housing dimensions may lie in the range of between about ±20 μm up to about ±1000 μm, depending on the dimensions of the housing and the number and type of manufacturing steps (e.g. including a galvanic coating of the outer surface of the housing). The first hard adaptor 20 alone may balance certain small tolerances between the geometry of the contacting surface of the first hard adaptor 20 and the marking surface of the article 10 by in particular elastically deforming the article 10, but larger differences may lead to a plastic deformation of the article 10 (e.g. the article 10 may break or fracture). The soft material layer of the present disclosure may be made from a transparent thermoplastic elastomer (TPE) or transparent silicone or transparent rubber (it may be sufficient if the transparency is given at the wavelength of the laser light to be used for activating the marking content. Suitable transparent TPE materials may be chosen, e.g., from Horst Müller Kunststoffe GmbH & Co. KG, Lichtenfels, Germany, e.g. Lifoflex© UV 30 GA 1030 having a Shore A hardness of 30, or from Bada AG, Bühl/Baden, Germany.

In some embodiments, the soft material layer is permanently connected with the first hard adaptor, but alternatively, the soft material layer may be arranged for easy replacement as a soft TPE material may have a certain proneness to degrade under application of mechanical stress and/or laser light (e.g. yellowing) and it may thus support cost efficient replacement if the soft material layer is either arranged as a separate layer similar to the first laser transfer foil or is non-permanently connected to the contacting surface of the first hard adaptor.

Figure 3:
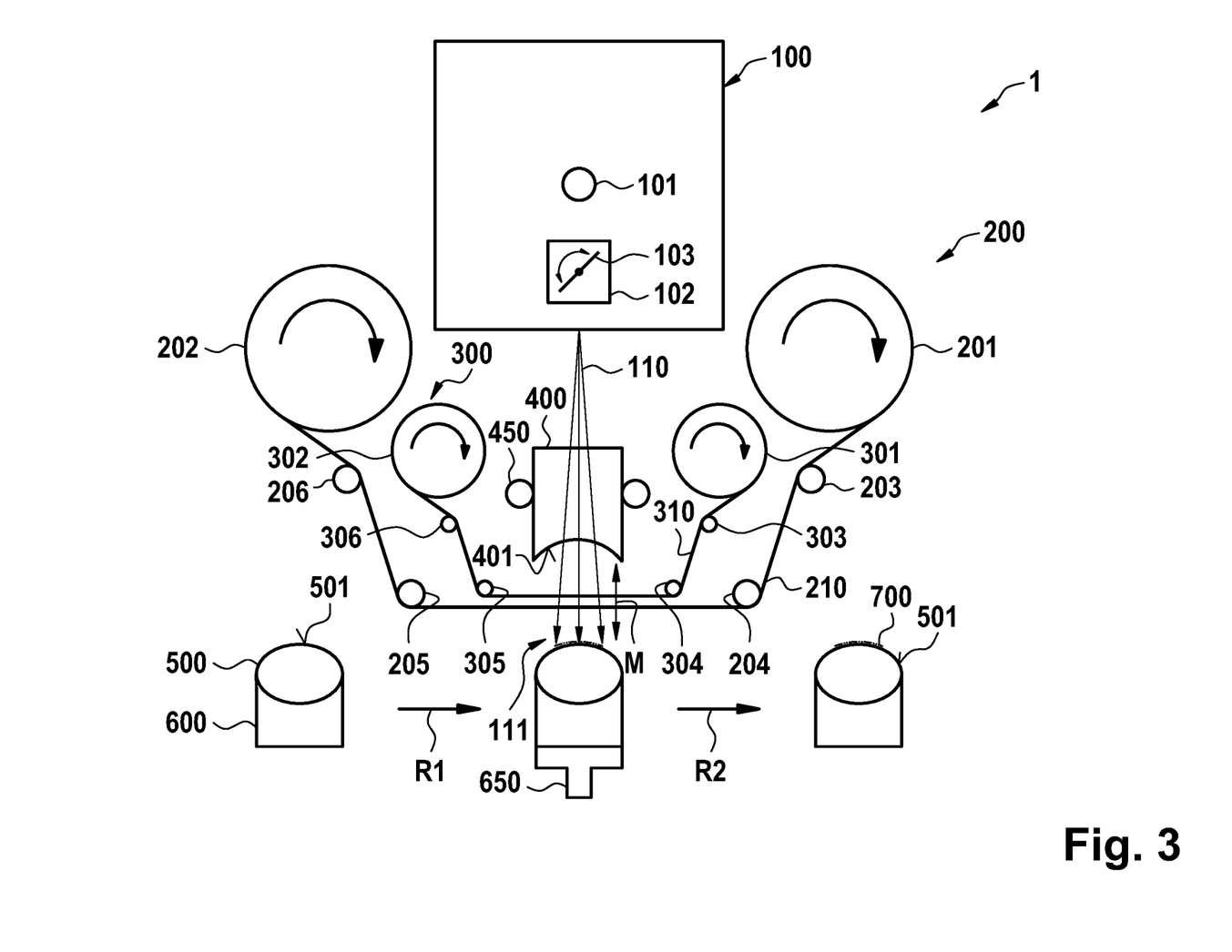
FIG. 3 is a schematic depiction of a device for laser-induced marking of an article.

FIG. 3 is a schematic depiction of an example embodiment of a device 1 for laser-induced marking of an article. The device 1 as shown comprises a first laser unit 100, a first foil unit 200, a soft layer unit 300, a first hard adaptor 400, a contacting unit 450, 650, and a carrier 600 for providing an article 500 at a transfer area. As will be discussed in the following, some of the parts of the shown example embodiment are optional.

The first laser unit 100 comprises a laser source 101 for emitting a first laser light 110 in the form of a laser beam. The first laser unit 100 may comprise a laser scanner unit 102 having at least one controllable mirror 103 for deflecting the (in particular switchable) beam of first laser light 110 so that the first laser light can be selectively applied at the transfer area. As an alternative, the laser light could only be switched on/off and the article could be moved.

The first foil unit 200 is arranged to provide a first laser transfer foil 210 at the transfer area and to move the first laser transfer foil 210 relative to the transfer area so that after a portion of the first laser transfer foil 210 was used, an unused portion can be transported to the transfer area. In the shown embodiment, the first foil unit comprises first and second storage rolls 201 and 202 on which the first laser transfer foil 210 is stored. Here, the unused first laser transfer foil 210 is unrolled from the first storage roll 201 and the used first laser transfer foil is rolled up on the second storage roll 202. Guiding rolls 203, 204, 205, 206 are arranged to guide the first laser transfer foil 210 between the first and second storage rolls 201, 202. In some embodiments, the first laser transfer foil 210 comprises a homogeneous marking content. Alternatively, the first laser transfer foil 210 may have successive regions of different marking content, e.g. alternately marking content of a first color and of a second color, even though more complex arrangements of different marking content are contemplated as well.

FIG. 3 shows an optional soft layer unit 300 that is arranged to provide a soft material layer 310 at the transfer area such that it will be located between the first hard adaptor 400 and the first laser transfer foil 210. As has been discussed in connection with FIG. 2, the soft material layer 310 may be used to balance geometrical tolerances of the articles provided at the transfer area. In the shown embodiment, the soft layer unit 300 comprises a first and a second storage roll 301 and 302. The unused soft material layer 310 is unrolled from the first storage roll 301 and the degraded soft material layer is rolled on the second storage roll 302. Guiding rolls 303, 304, 305, 306 are used to guide the soft material layer 310 between the storage rolls 301, 302 and the transfer area. As a degradation of the soft material layer 310 due to mechanical stress and potential yellowing due to the laser light may happen much slower than usage of the first laser transfer foil 210, the progression of the soft material layer 310 may happen only after a certain number of marking procedures, e.g. after 10 or 100 or 1000 or 10.000 or more marking operations.

The first hard adaptor 400 is arranged close to the transfer area. The first hard adaptor 400 has a contacting surface 401 that essentially is a negative of at least a part of a marking surface 501 of the article 500. The article 500 is here placed on a carrier 600 that is moved from a position outside of the transfer area to the transfer area (as indicated by arrow R1) and is moved after the marking process to position outside of the transfer area again (as indicated by arrow R2). The article 500 is then provided with a marking 700 on at least a part of its marking surface 501. Alternatively, the carrier may always stay in its position close to the transfer area and only the article is moved onto the carrier and away from it again after the marking process (which may happen in an automated way or in a manual manner). A contacting unit 650, 450 here comprises a first contacting subunit 450 that moves the first hard adaptor 400 towards the transfer area and a second contacting subunit 650 that moves the carrier 600 together with the article 500 towards the transfer area (as is indicated by double arrow M). The contacting unit 450, 650 moves the hard adaptor 400 and the article 500 until the first laser transfer foil 210 is in intimate contact with at least a part of the marking surface 501 of the article 500 and the contacting surface 401 of the first hard adaptor 400 as is shown in FIG. 1 (and optionally the soft material layer 310 is arranged between the first laser transfer foil 210 and the hard adaptor 400 as is shown in FIG. 2). Alternatively, the contacting unit may comprise only one unit that either moves the first hard adaptor or the article.

After the first laser transfer foil is brought into close contact with at least a portion of the marking surface of the article on the one side and the respective negative contacting surface of the first hard adaptor on the other side, the first laser light is irradiated through the first hard adaptor such that a sufficient amount of first laser light is absorbed by the first laser transfer foil and the marking content of the first laser transfer foil is transferred to the surface of the article. The first laser light may in particular be scanned over the marking surface by use of a scanning unit of the first laser unit (the first laser light may also be switched on and off during the scanning process so that a selective marking is achieved). In some embodiments, the first hard adaptor and the first laser transfer foil are then separated from the article and the first laser transfer foil is then moved with respect to the article. Then the first hard adaptor brings the first laser transfer foil again into intimate contact with the same portion of the marking surface of the article such that the first laser transfer foil is again sandwiched between the contacting surface of the first hard adaptor and the marking surface of the article. The first laser transfer foil may comprise areas having different marking content (e.g. different color pigments) and by relatively moving the first laser transfer foil with respect to the article, markings of different colors can be selectively applied onto the marking surface of the article.

As will be discussed further below with respect to FIG. 5, a second hard adaptor may be provided that has a contacting surface that essentially is either a negative of the same portion of the marking surface of the article as for the first hard adaptor or that has a contacting surface that essentially is a negative of a different portion of the marking surface of the article (the portions may overlap to a certain extent). Thus, after the first hard adaptor is separated from the article, a second hard adaptor is brought into contact with the article, while the first or a second laser transfer foil is sandwiched in between the second hard adaptor and the article. Between the separation and the contacting, the first laser transfer foil may be moved with respect to the article or the first laser transfer foil may be moved away and a second laser transfer foil may be moved in between the article and the second hard adaptor. The first and second laser transfer foil may have the same marking content or may have different marking content (e.g. different color pigments). In some embodiments, the first (and/or the second) laser transfer foil may have different sections with different marking content. In some embodiments, a second laser light (having a different wavelength than the first laser light) is used in a successive irradiation step (e.g. the second laser light may be adapted to a different marking content). The second laser light may be provided by a second laser unit, which may be a separated device (i.e. physically separate from a first laser unit for providing the first laser light) or the second laser unit may be integrated with the first laser unit into a single housing.

In some embodiments, a soft material layer is provided between the first (and/or second) hard adaptor and the first (and/or second) laser transfer foil, which soft material layer is essentially transparent to the first (and/or second) laser light. The soft material layer may be arranged to be replaceable, e.g. it may be provided as a sheet material that may be automatically moved relatively to the article or it may be detachably adhered to the first (and/or second) hard adaptor.

Figure 4A:
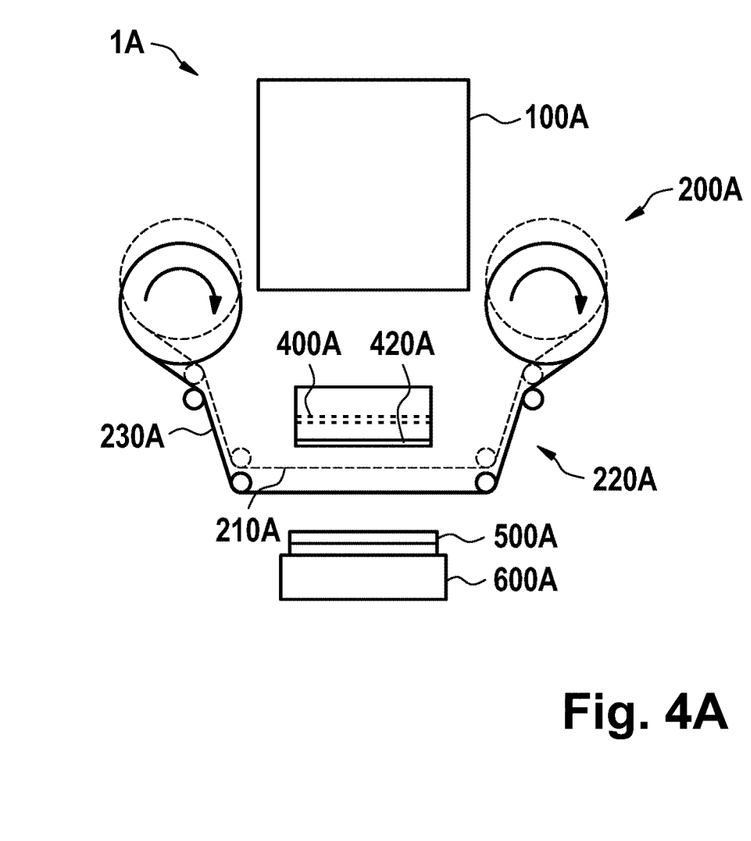
FIGS. 4A, 4B show a schematic depiction of another example embodiment of such a device.
Figure 4B:
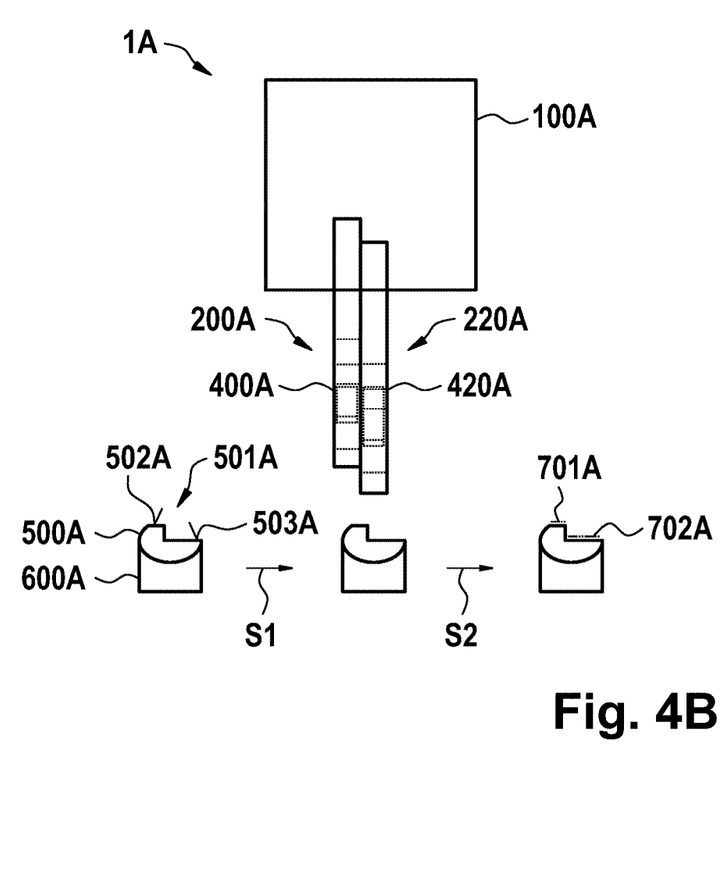

FIGS. 4A and 4B show a schematic depiction of another example embodiment of a device 1A for laser-induced marking of an article 500A. In this embodiment, at a single marking station, a first foil unit 200A and a second foil unit 220A are arranged to provide a first laser transfer foil 210A and a second laser transfer foil 230A, respectively, at a transfer area. A first hard adaptor 400A and a second hard adaptor 420A are provided to cooperate with the first and the second laser transfer foils 210A and 230A, respectively. The first hard adaptor 400A has a contacting surface that essentially is a negative of a first portion 502A of a marking surface 501A of an article 500A and the second hard adaptor 420A has a contacting surface that essentially is a negative of a second portion 503A of the marking surface 501A of the article 500A. In the shown embodiment, the first and second portions 502A, 503A of the marking surface 501A of the article 500A do not overlap and the first and second hard adaptors 400A, 420A can simultaneously contact the respective first and second portions 502A, 503A of the marking surface 501A of the article 500A. In other embodiments, the first and second portions 502A and 503A may overlap at least partially and the first and second adaptors 400A, 420A may then sequentially contact the respective first and second portions 502A and 503A, while the article 500A may be moved relatively to the second hard adaptor in between the sequential contacting and marking steps. In the embodiment as shown, the article 500A is placed on a carrier 600A and is moved from a position outside of the transfer area to the transfer area as indicated by arrow S1. Then the first and second hard adaptors 400A and 420A simultaneously bring the first and second laser transfer foils 210A and 230A, respectively, into intimate contact with the first and second portions 502A and 503A, respectively, of the marking surface 501A of the article 500A. A first laser light may then be sequentially irradiated from a first laser unit 100A onto the first and second laser transfer foils 210A and 230A. Alternatively, a second laser unit may be present that simultaneously irradiates a second laser light (which may have the same or a different wavelength than the first laser light) onto the second laser transfer foil, while the first laser light is irradiated onto the first laser transfer foil. The second laser unit may be housed together with the first laser unit or they may be provided as separate units. After the marking process, the article 500A is provided with two markings 701A and 702A on its marking surface 501A and the article 500A is moved again away from the transfer area as indicated by arrow S2.

It is noted, that wherever a "second" feature is mentioned (e.g. a second hard adaptor, a second laser transfer foil etc.) this shall not exclude that even further manifestations of this feature may be present (e.g. a third laser transfer foil may be used, a fourth laser transfer foil etc., a third hard adaptor etc.).

Figure 5:
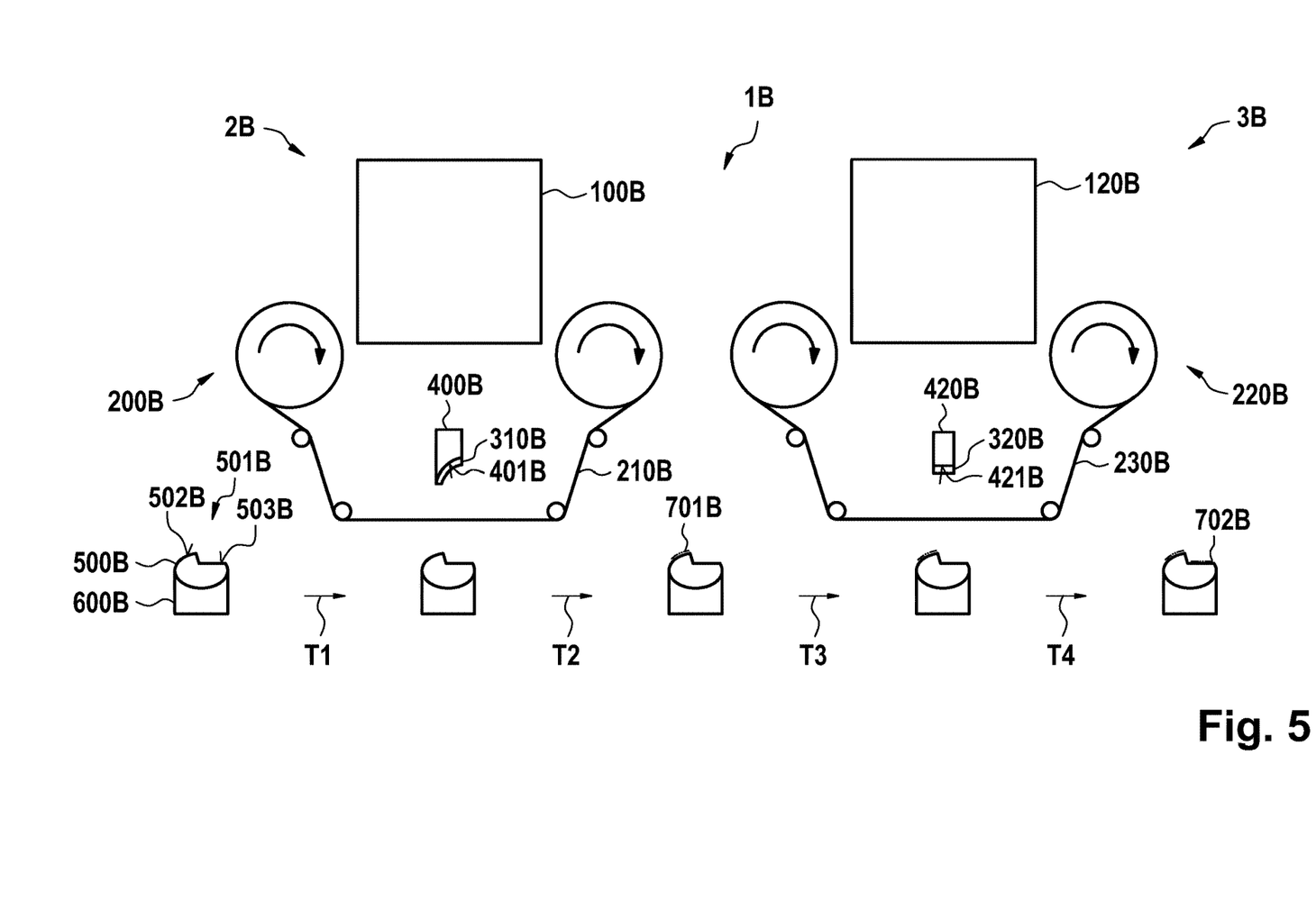
FIG. 5 is a schematic depiction of a further example embodiment of such a device.

FIG. 5 is a schematic depiction of a further example embodiment of a device 1B for laser-induced marking of an article 500B. It has a staggered buildup comprising two sub-devices 2B and 3B arranged in succession to each other. The first sub-device 2B comprises a first laser unit 100B, a first foil unit 200B, and a first hard adaptor 400B. The second sub-device 3B comprises a second laser unit 120B, a second foil unit 220B, and a second hard adaptor 420B. The first foil unit 200B is arranged to provide a first laser transfer foil 210B at a first transfer area and the second foil unit 220B is arranged to provide a second laser transfer foil 230B at a second transfer area. The first and second laser transfer foils 210B and 230B may comprise the same marking content or they may have different marking content. The first and second laser units 100B and 120B may be essentially identical or the first laser unit 100B may emit a first laser light different in wavelength to a second laser light emitted by the second laser unit 120B (which shall not imply that the laser units 100B and 120B would not potentially have further differences in their design). In the shown embodiment, the first and second foil units 200B and 220B shall function again as was described with respect to FIG. 3. It shall be noted that of course the same alternative arrangements can be used for each of the foil units that have been described or indicated before.

An article 500B having a marking surface 501B that has two differently structured portions 502B and 503B is placed on a carrier 600B. The carrier 600B (together with the article 500B) is moved from a first position outside of device 1B to a position at or close to the first transfer areas of the first sub-device 2B (as indicated by arrow T1) and is moved after the marking process (the article 500B then has a first marking 701B on the first portion 502B of its marking surface 501B) away from the first transfer area (as indicated by arrow T2) and then to the second transfer area of the second sub-device 3B (as indicated by arrow T3). After the second marking process, the carrier 600B is moved away from the second transfer area (as indicated by arrow T4) and then the article 500B carries a second marking 702B on the second portion 503B of its marking surface 501B.

The first sub-device 2B comprises a first hard adaptor 400B having a contacting surface 401B that essentially is a negative of at least a portion of the first portion 502B of the marking surface 501B of the article 500B. In the shown embodiment, the first hard adaptor 400B has a soft material layer 310B provided on its contacting surface 401B. Alternatively, a first soft layer unit may be provided as shown and discussed in connection with FIG. 3. The marking process happens as has been previously described. The second sub-device 3B comprises a second hard adaptor 420B having a contacting surface 421B that essentially is a negative of at least a portion of the second portion 503B of the marking surface 501B of the article 500B. In the shown embodiment, the second hard adaptor 420B has a soft material layer 320B provided on its contacting surface 421B. Alternatively, a second soft layer unit may be provided as shown and discussed in connection with FIG. 3.

The marking process again happens as has been previously described. It is noted that further sub-devices may be added.

Alternatively, the first and second hard adaptors 400B and 420B may be designed to fit onto the same portion of the marking surface 501B of the article 500B and the first and second laser transfer foils 200B and 230B may be provided with different marking content.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm"

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

The invention claimed is:

1. A device for laser-induced marking of an article having a marking surface comprising an at least partially curved portion to be marked, the device comprising:
    a first laser unit configured to emit and scan a first laser light over a first transfer area;
    a first foil transporter for configured to provide a first laser transfer foil at the first transfer area;
    a carrier configured to provide the article at the first transfer area, the article having a marking surface comprising an at least partially curved surface area;
    a first hard adaptor that is transparent to the first laser light, the first hard adaptor being substantially rigid, the first hard adaptor having a first contacting surface that is dimensionally a negative of the at least partially curved surface area of the marking surface;
    a press configured to place the first laser transfer foil in contact with the marking surface by causing at least one of the first laser transfer foil and the marking surface to move towards one another,
    an elastic material layer arranged between the first hard adaptor and the first laser transfer foil, the elastic material layer being transparent to the first laser light, and
    wherein the first laser transfer foil comprises at least one marking material therein.

2. The device of claim 1, comprising a second hard adaptor that is transparent to the first laser light or a second laser light different from the first laser light and having a contacting surface that essentially is a negative of at least a part of the marking surface of the article.

3. The device of claim 1, wherein the first laser transfer foil has at least two areas of different dyes.

4. The device of claim 1, comprising at least one deformable material layer having an optical transparency to the first laser light between the hard adaptor and the first laser transfer foil.

5. The device of claim 4, wherein the at least one deformable material layer has a thickness between about 0.05 mm and about 5.0 mm.

6. The device of claim 5, wherein the at least one deformable material layer is made from a thermoplastic elastomer having an optical transparency to the first laser light.

7. The device of claim 1, wherein the marking surface of the article comprises a plastic material.

8. The device of claim 1, wherein the first laser light has a wavelength of between about 100 nm and about 20000 nm.

9. The device of claim 1, wherein the first laser light has a wavelength of between about 150 nm and about 1200 nm.

* * * * *